United States Patent
Chae et al.

(10) Patent No.: US 7,824,940 B2
(45) Date of Patent: Nov. 2, 2010

(54) LIQUID CRYSTAL DISPLAY DEVICE AND METHOD OF FABRICATING THE SAME

(75) Inventors: Gee-Sung Chae, Incheon (KR); Yong-Sup Hwang, Gyeonggi-Do (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 12/453,050

(22) Filed: Apr. 28, 2009

(65) Prior Publication Data

US 2009/0233391 A1    Sep. 17, 2009

Related U.S. Application Data

(62) Division of application No. 10/664,931, filed on Sep. 22, 2003, now Pat. No. 7,532,267.

(30) Foreign Application Priority Data

Dec. 31, 2002    (KR) .............................. 2002-88430

(51) Int. Cl.
*H01L 21/84* (2006.01)
(52) U.S. Cl. ........................................ 438/30; 438/158
(58) Field of Classification Search ......... 438/151–166, 438/30
See application file for complete search history.

(56) References Cited

U.S. PATENT DOCUMENTS

| 5,327,001 | A | 7/1994 | Wakai et al. |
| 5,349,205 | A | 9/1994 | Kobayashi et al. |
| 6,157,430 | A | 12/2000 | Kubota et al. |
| 6,297,519 | B1 | 10/2001 | Fujikawa et al. |
| 6,337,235 | B1* | 1/2002 | Miyanaga et al. ........... 438/166 |
| 6,433,842 | B1 | 8/2002 | Kaneko et al. |
| 6,549,249 | B2 | 4/2003 | Jung et al. |
| 6,620,655 | B2 | 9/2003 | Ha et al. |
| 6,800,873 | B2 | 10/2004 | Zhang |
| 6,801,267 | B2 | 10/2004 | Satake |

FOREIGN PATENT DOCUMENTS

| KR | 1999-00066401 | 8/1999 |
| KR | 2001-0002981 | 1/2001 |

* cited by examiner

*Primary Examiner*—Richard A. Booth
(74) *Attorney, Agent, or Firm*—Morgan Lewis & Bockius LLP

(57) ABSTRACT

A liquid crystal display device includes a plurality of gate lines and data lines crossing each other to define a plurality of pixel regions, a plurality of thin film transistors, each disposed in one of the pixel regions, and a plurality of pixel electrodes, each disposed in one of the pixel regions, wherein the thin film transistor includes at least one Ti layer.

18 Claims, 26 Drawing Sheets

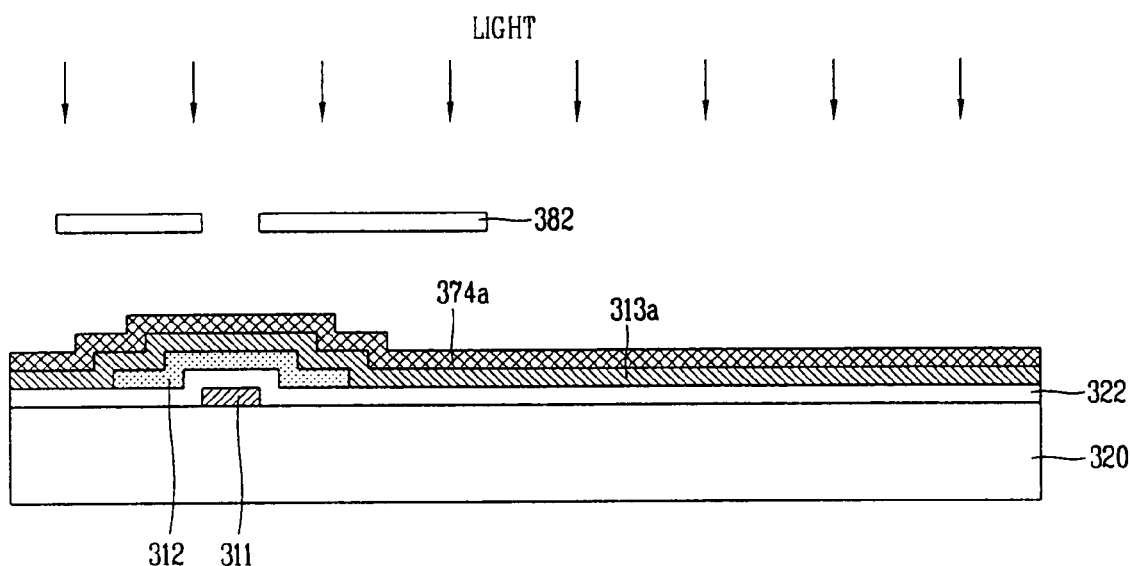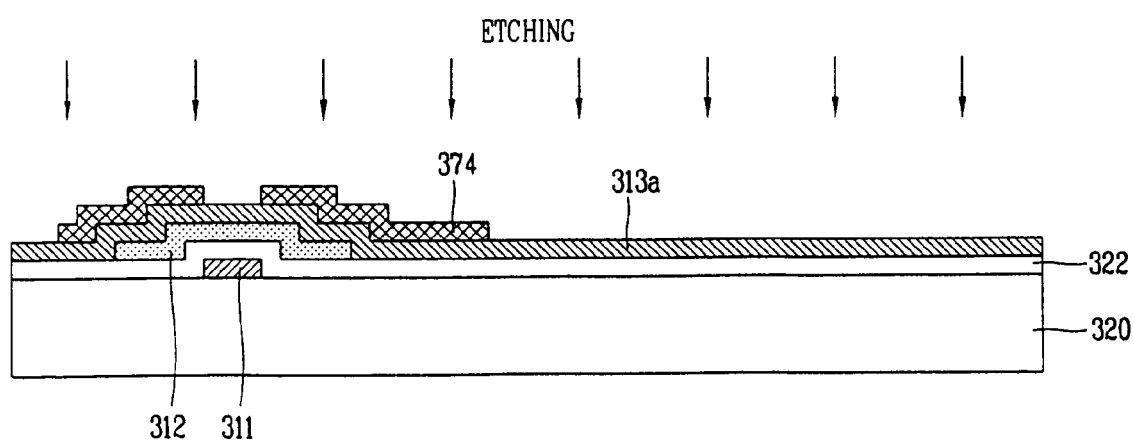

US 7,824,940 B2

LIQUID CRYSTAL DISPLAY DEVICE AND METHOD OF FABRICATING THE SAME

This is a divisional of U.S. patent application Ser. No. 10/664,931, filed Sep. 22, 2003 now U.S. Pat. No. 7,532,267, which is hereby incorporated by reference. The present invention claims the benefit of Korean Patent Application No. 88430/2002 filed in Korea on Dec. 31, 2002, which is hereby incorporated by reference.

BACKGROUND OF THE INVENTION

1. Field of the Invention

The present invention relates to a display device and method of fabricating a display device, and more particularly, to a liquid crystal display device and a method of fabricating a liquid crystal display device.

2. Description of the Related Art

In flat panel display devices having active devices, such as a liquid crystal display (LCD) devices, thin film transistors (TFTs) are disposed in each pixel region to drive pixel cells in the display device. A driving method using the TFTs is commonly referred to as an active matrix driving method, wherein the active devices are placed within each pixel region and are arranged in a matrix configuration to drive the individual pixel cells.

FIG. 1 is a plan view of an LCD device according to the related art. In FIG. 1, an LCD device includes an N×M-number of pixels arranged along vertical and horizontal directions wherein each pixel includes a TFT 10 formed at crossing regions of a gate line 3, which receives a scan signal from an external driving circuit, and a data line 5, which receives an image signal. The TFT 10 includes a gate electrode 11 connected to the gate line 3, a semiconductor layer 12 formed on the gate electrode 11 to be activated by a scan signal supplied to the gate electrode 11, and source and drain electrodes 13 and 14 formed on the semiconductor layer 12. In addition, a pixel electrode 16 is formed within a display region of the pixel and is connected to the drain electrode 14 to drive liquid crystal molecules according to the activation of the semiconductor layer 12.

FIG. 2 is a cross sectional view along I-I' of FIG. 1 according to the related art. In FIG. 2, the TFT 10 is formed on a first substrate 20 made of a transparent material, such as a glass, and includes the gate electrode 11 formed on the first substrate 20, a gate insulating layer 22 deposited over the first substrate 20, the semiconductor layer 12 formed on the gate insulating layer 22, the source and drain electrodes 13 and 14 formed on the semiconductor layer 12, and a passivation layer 24 disposed over an entire area of the first substrate 20. In addition, a pixel electrode 16 is formed on the passivation layer 24 and is connected to the drain electrode 14 through a contact hole 26.

In FIG. 2, a black matrix 32 and a color filter layer 34 are formed on a second substrate made of a transparent material, such as glass. The black matrix 32 is formed in a non-display region, such as the TFT forming region, and in a region between pixels to block light transmission in the non-display region. In addition, the color filter layer 34 includes red (R), green (G), and blue (B) layers formed on the second substrate 30, wherein the first and second substrates 20 and 30 are bonded together with a liquid crystal material layer 40 formed therebetween.

FIGS. 3A-3I are cross sectional views of a method of fabricating an LCD device according to the related art. In FIG. 3A, a metal layer 11a is deposited on a first substrate 20 (i.e., TFT substrate), and a photoresist layer 60a is deposited on the metal layer 11a, wherein the deposited photoresist layer 60a is then baked at a certain temperature. Next, a mask 70 is positioned above the baked photoresist layer 60a, and light, such as ultraviolet light, is irradiated onto the photoresist layer 60a.

In FIG. 3B, a developer is applied to the photoresist layer 60a, thereby forming a photoresist pattern 60 on the metal layer 11a. Accordingly, since the photoresist is a negative photoresist, regions that are not affected by the ultraviolet light are removed by the developer.

In FIG. 3C, a portion of the metal layer 11a covered by the photoresist pattern 60, is removed by applying an etchant to the metal layer 11a. Accordingly, a gate electrode 11 is formed on the first substrate 20.

In FIG. 3D, a gate insulating layer 22 is formed over the first substrate 20 and a semiconductor layer 12a is formed thereon. Then, a photoresist layer is deposited on the semiconductor layer 12a and ultraviolet light is irradiated onto the photoresist layer using a mask. Next, a developer is applied to portions of the photoresist layer that may been irradiated with the ultraviolet light to form a photoresist pattern 62 on the semiconductor layer 12a.

In FIG. 3E, an etchant is applied to the semiconductor layer 12a using the photoresist pattern 62 as an etch-blocking mask to form a semiconductor layer 12 on the insulating layer 22.

In FIG. 3F, a metal layer (not shown) is deposited on an entire surface of the first substrate 20, and a photoresist pattern (not shown) is formed on the metal layer using a mask. Then, the metal layer is etched using the photoresist pattern as an etch-blocking mask to form source and drain electrodes 13 and 14 on the semiconductor layer 12.

In FIG. 3G, a passivation layer 24 is deposited on the first substrate 20 including the source and drain source electrodes 13 and 14. Then, a portion of the passivation layer 24 formed on the drain electrode 14 is etched using the photolithographic processes described above, thereby forming a contact hole 26 exposing a portion of the drain electrode 14.

In FIG. 3H, a transparent material, such as indium tin oxide (ITO), is deposited on the passivation layer 24 and etched using the above-described photolithographic processes to form a pixel electrode 16 on the passivation layer 24. In addition, the pixel electrode 16 is electrically connected to the drain electrode 14 via the contact hole 26 formed in the passivation layer 24.

In FIG. 3I, a black matrix 32 and a color filter layer 34 are formed on a second substrate 30 (i.e., color filter substrate), and the first and second substrates 20 and 30 are bonded together with a liquid crystal material layer 40 sandwiched therebetween.

Accordingly, as described above, the source and drain electrodes 13 and 14 and the semiconductor layer 12 are formed using photolithographic processes including the photoresist layers. However, using the photoresist layers is problematic. For example, the photolithographic processes are complicated since the photoresist patterns are formed through repeated processing including photoresist depositing, baking, irradiating, and developing. In addition, the baking process actually includes a soft baking process and a hard baking process that are performed at separate temperatures.

Moreover, since the fabrication processes include forming of a plurality of patterns (or electrodes), a plurality of photoresist processes are required. Accordingly, since photoresist processing must be performed to create each of the patterned lines, fabrication costs increase. For example, the fabrication costs of the photoresist process are approximately 40-45% of a total cost of the TFT substrate process.

Furthermore, the fabrication processes generate significant amounts of environment contaminants. In general, since the photoresist layer is formed by deposited photoresist material using a spin coating method, most of the photoresist material may be discarded. Accordingly, the discarded photoresist material increases fabrication costs of the TFT substrate and introduces contaminants into the environment.

In addition, performance of the LCD device may degrade due to remnant amounts of the photoresist material. For example, since the photoresist material is coated using the spin coating method, it is difficult to control a thickness of the photoresist layer. Accordingly, the photoresist layer has a non-uniform thickness and portions of the photoresist layer may remain after the photoresist pattern is supposed to be completely removed.

SUMMARY OF THE INVENTION

Accordingly, the present invention is directed to a liquid crystal display device and a method of fabricating a liquid crystal display device that substantially obviates one or more of the problems due to limitations and disadvantages of the related art.

An object of the present invention is to provide a liquid crystal display device that includes a TiN layer formed during fabrication.

Another object of the present invention to provide a method of fabricating a liquid crystal display device having simplified fabrication processes and reduced fabrication costs.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device includes a plurality of gate lines and data lines crossing each other to define a plurality of pixel regions, a plurality of thin film transistors, each disposed in one of the pixel regions, and a plurality of pixel electrodes, each disposed in one of the pixel regions, wherein the thin film transistor includes at least one Ti layer.

In another aspect, a liquid crystal display device includes a plurality of gate lines and data lines cross each other to define a plurality of pixel regions, a thin film transistor in each pixel region, a pixel electrode in each pixel region, and a metal masking layer in the thin film transistor.

In another aspect, a method of fabricating a liquid crystal display device includes providing a first substrate, forming a gate electrode on a first substrate, forming a gate insulating layer on an entire surface of the first substrate including the gate electrode, forming a semiconductor layer on the gate insulating layer, forming source/drain electrodes on the semiconductor layer, forming a passivation layer on the gate insulating layer and the source/drain electrodes, and forming a pixel electrode on the passivation layer, wherein at least one of the gate electrode, semiconductor layer, source/drain electrodes, and pixel electrode is formed using a Ti layer and a TiN layer.

In another aspect, a method of fabricating a liquid crystal display device includes forming a gate electrode on a first substrate, forming a gate insulating layer on an entire surface of the first substrate, forming a semiconductor layer on the gate insulating layer, forming source/drain electrodes on the semiconductor layer, forming a passivation layer on the source/drain electrodes, and forming a pixel electrode on the passivation layer, wherein at least one of the gate electrode, semiconductor layer, source/drain electrodes, and pixel electrode is formed using a Ti masking layer and Ti pattern.

In another aspect, a patterning method includes forming an etching subject layer on a substrate, forming a Ti layer on the etching subject layer, irradiating light onto the Ti layer using a mask to form a TiN layer, etching the TiN layer to form a Ti pattern layer, etching the etching subject layer using the Ti pattern layer, and removing the Ti pattern layer.

It is to be understood that both the foregoing general description and the following detail description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 6A-6J are cross sectional views of an exemplary method of fabricating an LCD device according to the present invention;

DETAILED DESCRIPTION OF THE PREFERRED EMBODIMENTS

Reference will now be made in detail to the preferred embodiments of the present invention, examples of which are illustrated in the accompanying drawings.

Figure 1:
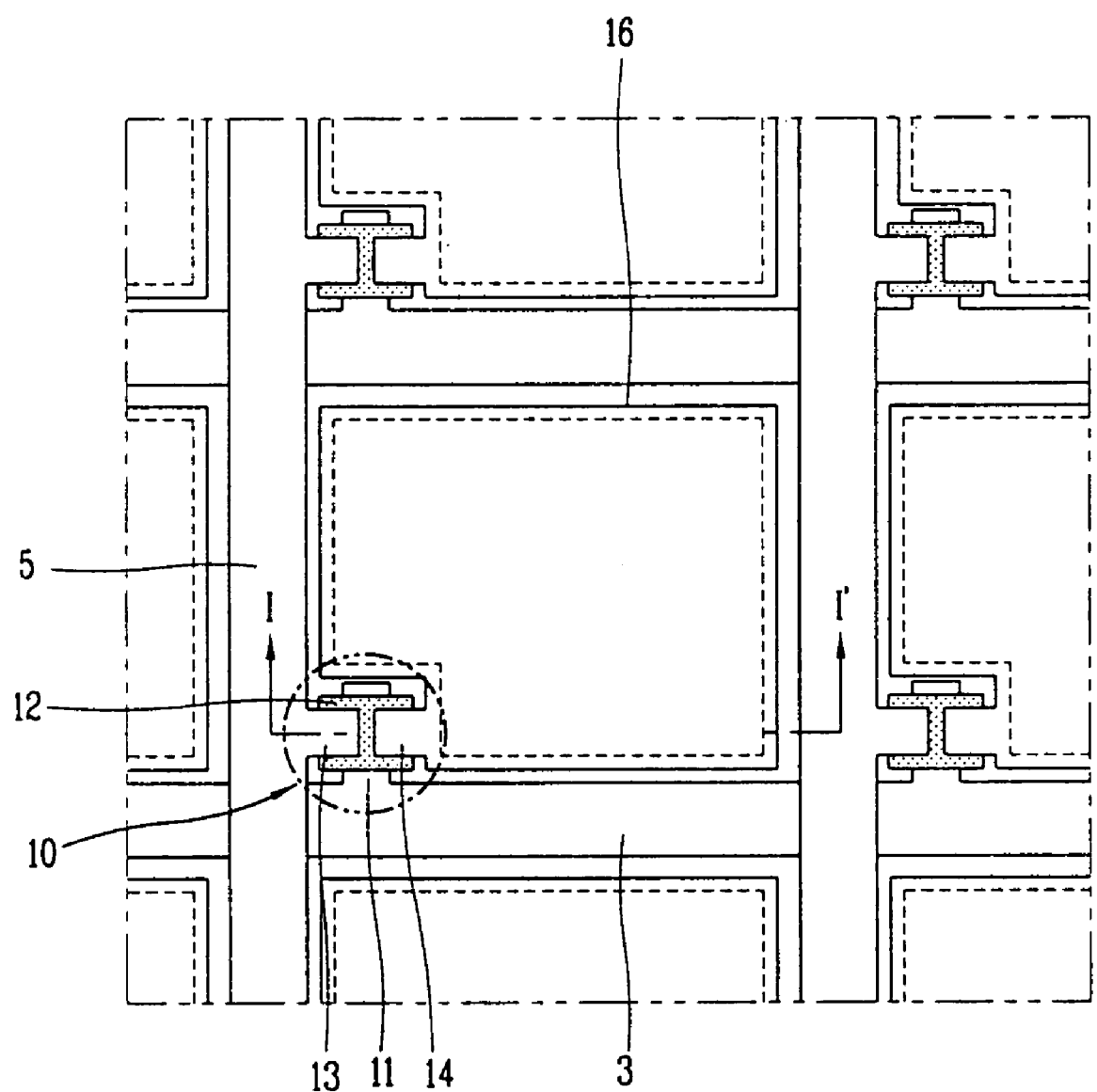
FIG. 1 is a plan view of an LCD device according to the related art.
Figure 2:
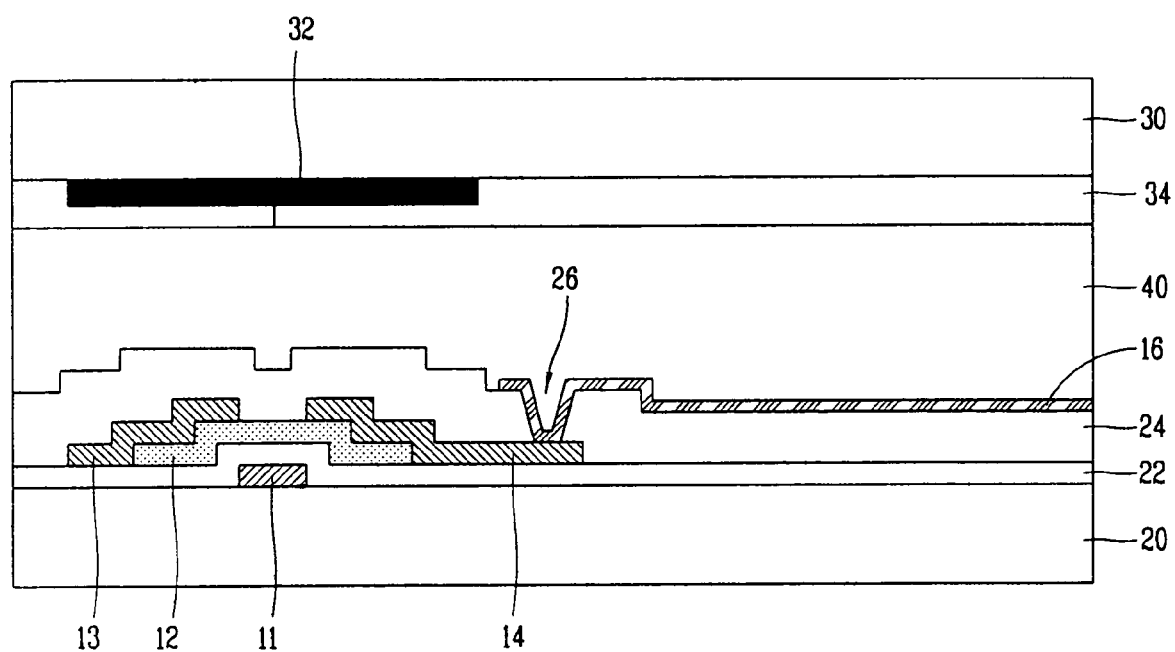
FIG. 2 is a cross sectional view along I-I' of FIG. 1 according to the related art.
Figure 3A:
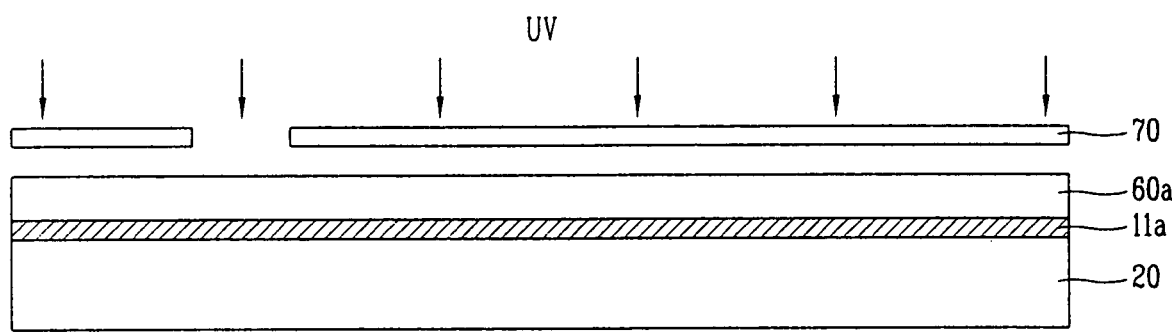
FIGS. 3A-3I are cross sectional views of a method of fabricating an LCD device according to the related art.
Figure 3B:
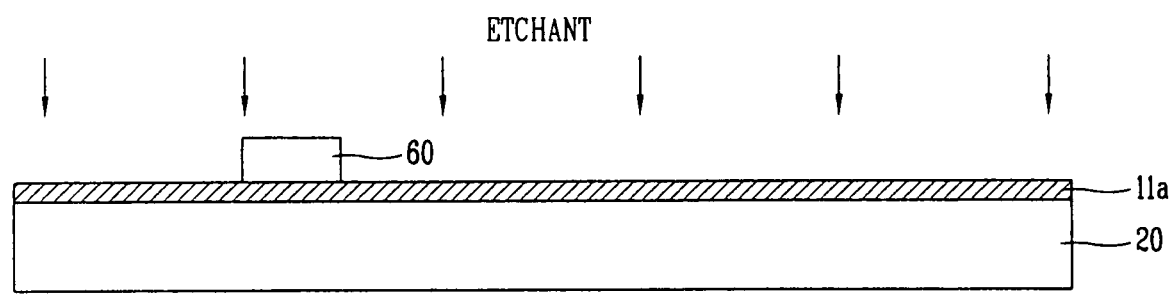
Figure 3C:
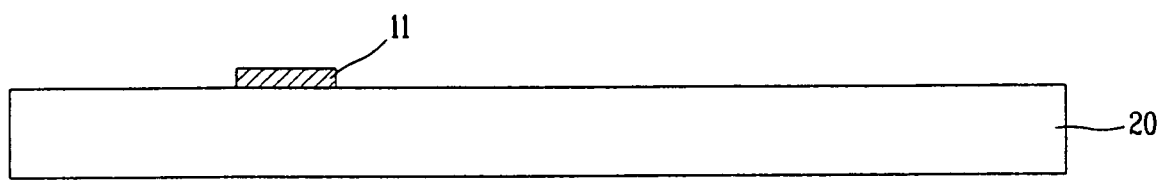
Figure 3D:
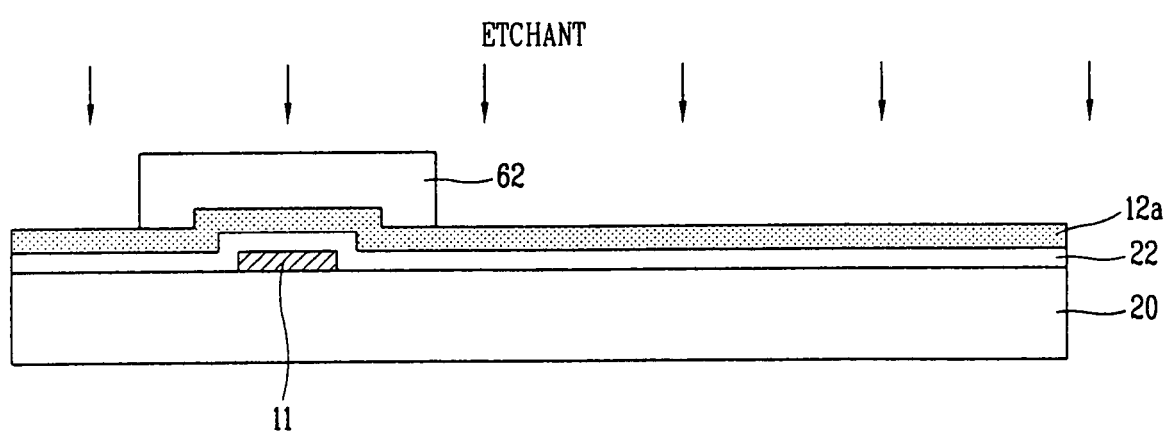
Figure 3E:
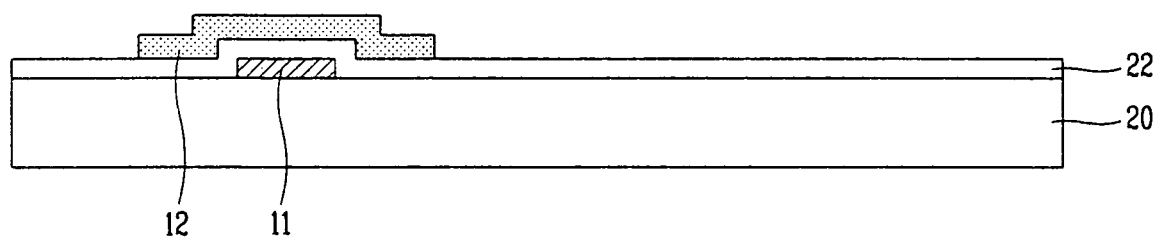
Figure 3F:
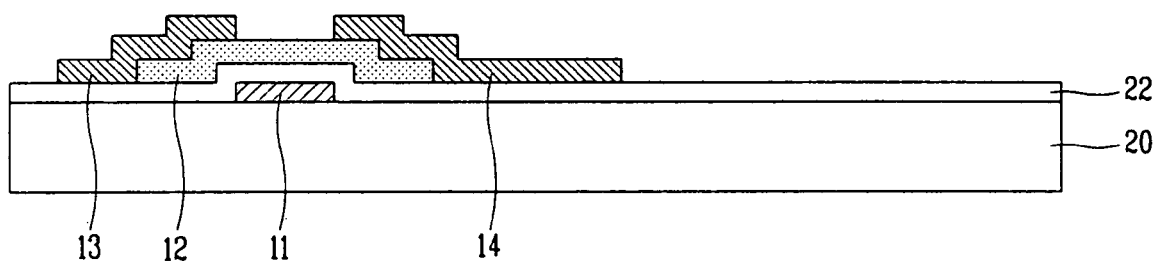
Figure 3G:
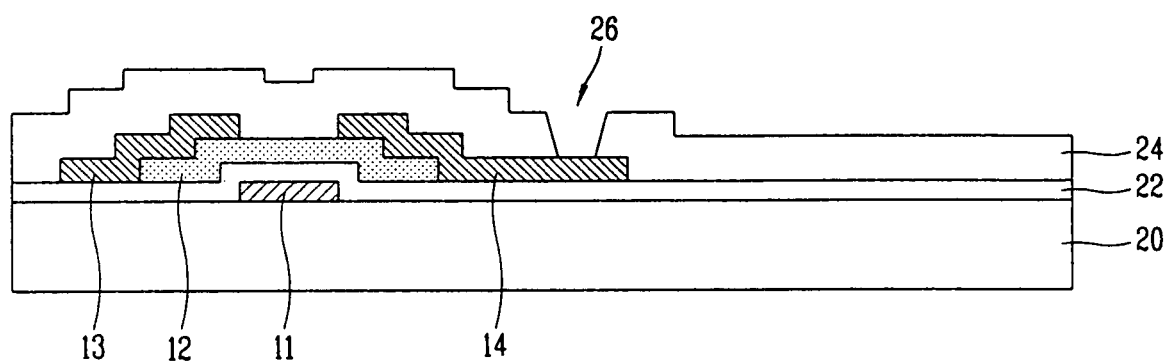
Figure 3H:
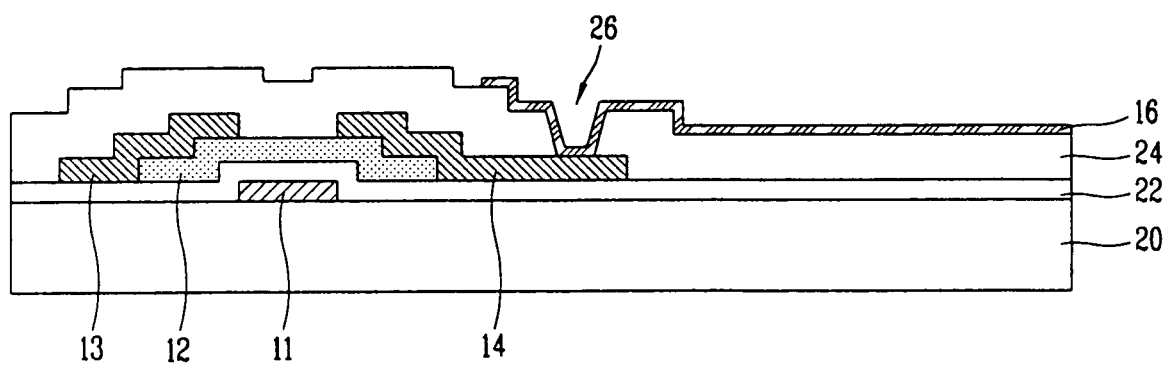
Figure 3I:
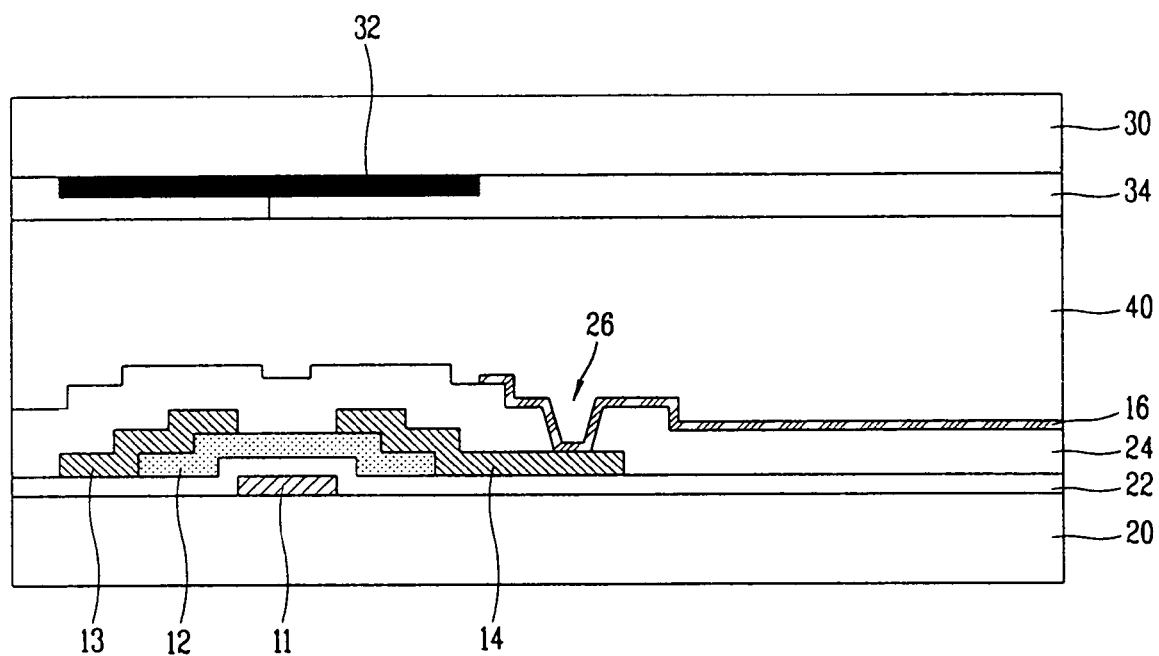
Figure 4A:
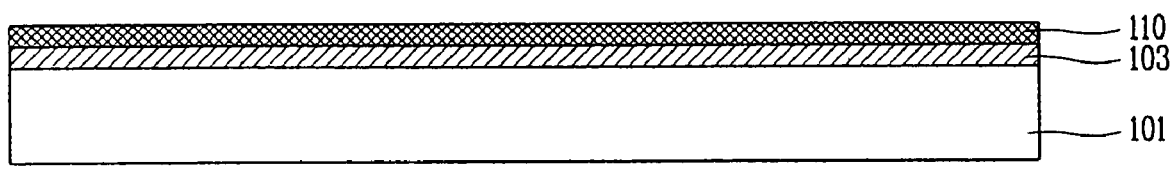
FIGS. 4A-4F are cross sectional views of an exemplary patterning method for an LCD device according to the present invention.

FIGS. 4A-4F are cross sectional views of an exemplary patterning method for an LCD device according to the present invention. In FIG. 4A, a metal layer 103 may be formed on a substrate 101 made of an insulating material, such as glass or semiconductor materials, and a Ti layer 110 may be formed on the metal layer 103 by evaporating or sputtering processes, for example.

Figure 4B:
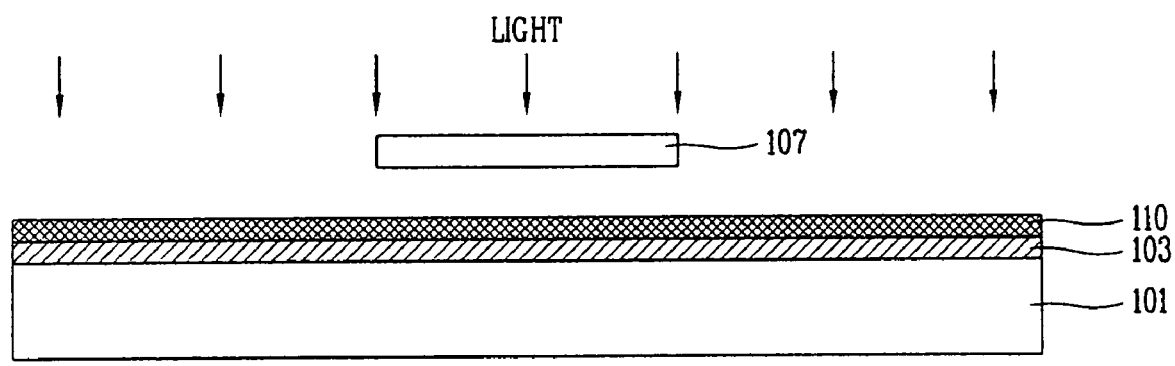

In FIG. 4B, regions of the metal layer 103 that will be used to form a metal pattern may be blocked using a mask 107, and light, such as ultraviolet or laser light, may be irradiated onto unblocked portions of the Ti layer 110. Accordingly, the light may be irradiated within a nitrogen atmosphere, wherein the portions of the Ti layer 110 that have been irradiated with light may be converted into TiN during a nitrification process. Initially, the nitrification process begins from an upper surface of the Ti layer 110 that receives the light, whereby an entire thickness of the Ti layer 110 eventually is converted into TiN.

Figure 4C:
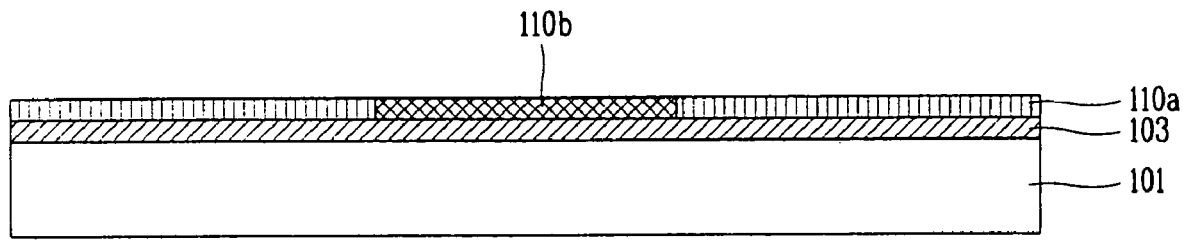

In FIG. 4C, a Ti layer 110b may be formed in the region where the metal pattern is to be formed, and a TiN layer 110a may be formed in the regions where the metal layer 103 is to be subsequently etched.

Figure 4D:
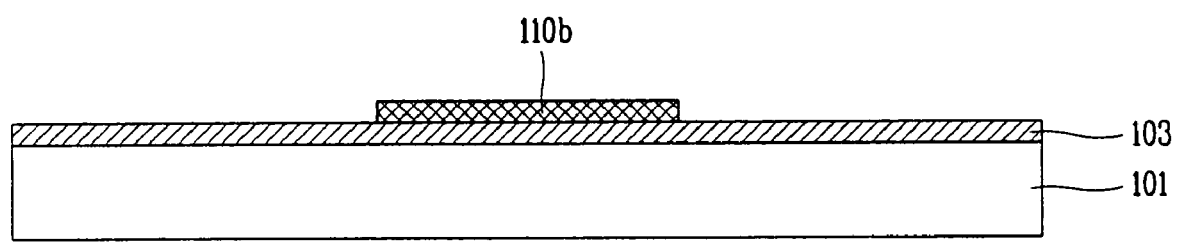

In FIG. 4D, the Ti layer 110b may be patterned by removing the TiN layer 110a using a dry etching process. During the dry etching process, an etching rate of TiN to $Cl_2$ gas is faster than an etching rate of Ti, wherein $Cl_2$ gas or a $Cl_2$ mixed gas may be used as the etching gas.

Figure 4E:
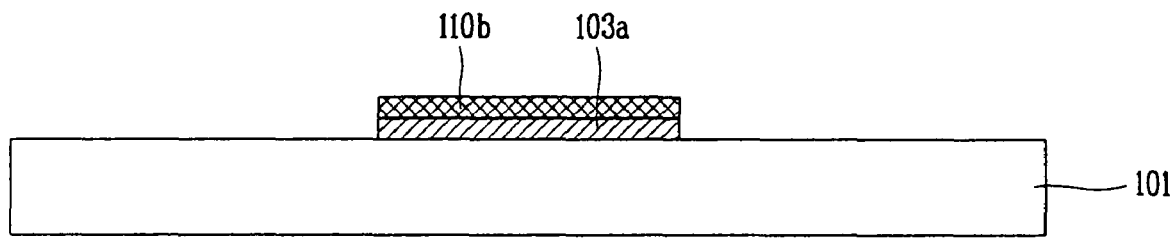

In FIG. 4E, portions of the metal layer 103 may be removed using wet or dry etching processes, wherein the portion of the metal layer 103 blocked with the Ti pattern 110b may remain on the surface of the substrate 101.

Figure 4F:
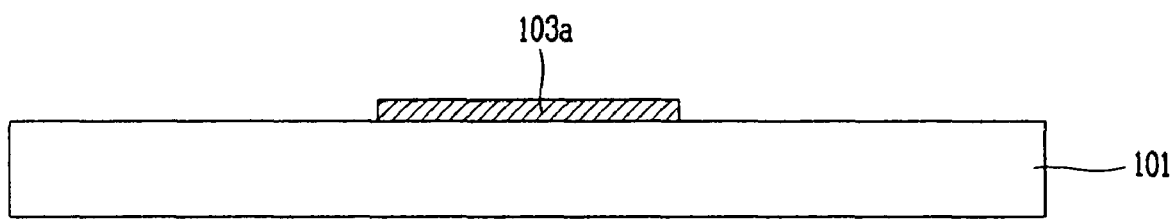

In FIG. 4F, the Ti pattern 110b may be remove by an etching process. During the wet etching process, since HF reacts with Ti to form TiF, which may be removed, and $SO_4$ ions do not react with Ti, an acid, except for $H_2SO_4$, may be used as the etchant. During the dry etching process, the Ti pattern 110b may be removed, wherein $Cl_2$ or a $Cl_2$ mixed gas may be used as the etching gas.

Figure 5A:
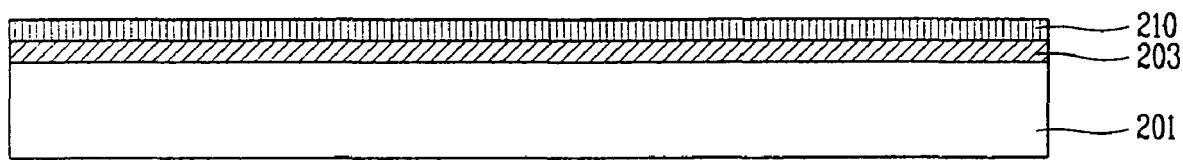
FIGS. 5A-5F are cross sectional views of another exemplary patterning method for an LCD device according to the present invention.

FIGS. 5A-5F are cross sectional views of another exemplary patterning method for an LCD device according to the present invention. In FIG. 5A, a metal layer 203 may be formed on a substrate 201 made of an insulating material, such as glass or semiconductor material, and a TiOx layer, such as $TiO_2$, may be deposited on the metal layer 203. The TiOx layer 210 may be directly formed on the metal layer 203 by evaporating or sputtering methods. In addition, the TiOx layer 210 may be formed by depositing a Ti layer on the metal layer 203 and oxidizing the deposited Ti by supplying heat and irradiating the Ti layer with light.

Figure 5B:
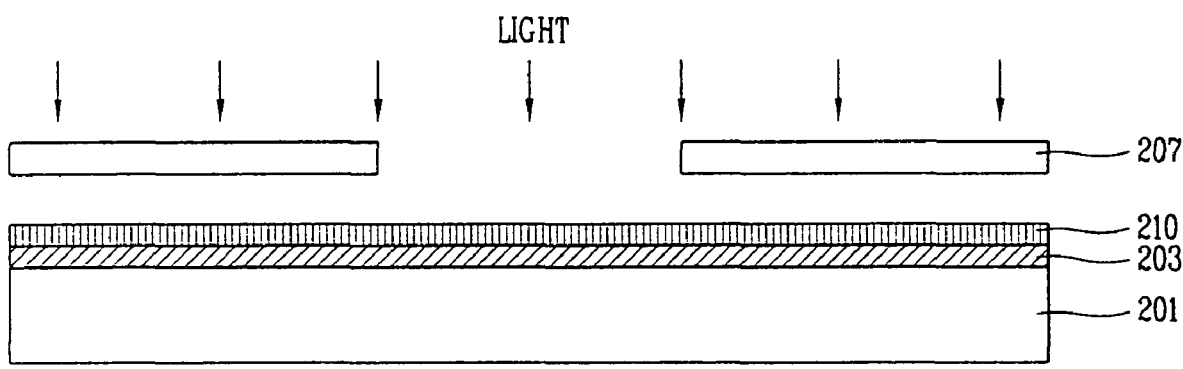

In FIG. 5B, a mask 207 may be used to prevent portions of the TiOx layer 210 from being exposed to light, such as ultraviolet or laser light. Accordingly, surface portions of the TiOx layer 210 may be formed to have hydrophilic properties. For example, $TiO_2$ has hydrophobic properties, but when the $TiO_2$ is exposed to ultraviolet or laser light, OH radicals are generated on a surface of the $TiO_2$ to covert the surface from hydrophobic to hydrophilic. By irradiating the ultraviolet or laser light onto the TiOx layer, a contact angle, which is commonly considered a standard for measuring wettability of a surface of a solid, gradually decreases. Accordingly, when the ultraviolet or laser light is irradiated for a certain amount of time (i.e., 1 hour), the contact angle is approximately 0 degrees (i.e., the TiOx layer is converted to have hydrophilic properties).

Figure 5C:
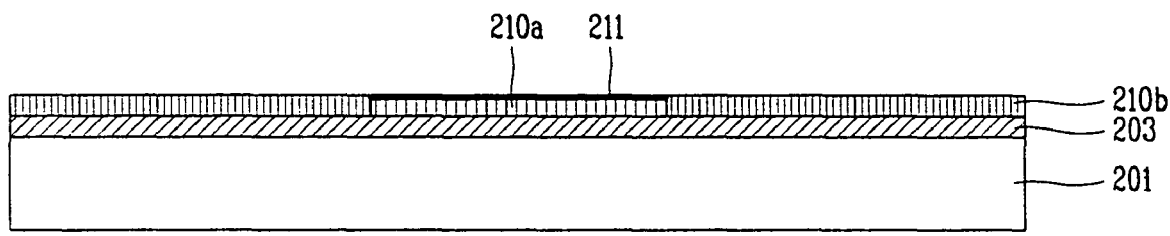

In FIG. 5C, by irradiating ultraviolet rays to the TiOx layer, the TiOx layer is divided into a first TiOx layer 210a having a surface 211 possessing hydrophilic properties and a second TiOx layer 210b having hydrophobic properties. Accordingly, when an etching solution (i.e., etchant), such as $H_2SO_4$ or an alkali group-based etching solution, is applied to the first and second TiOx layers 210a and 210b each having different surface properties, OH radicals of the first TiOx layer 210a having hydrophilic properties are combined with $SO_4$ ions. In other word, a surface of the first TiOx layer 210a may be protected by the OH radicals.

Figure 5D:
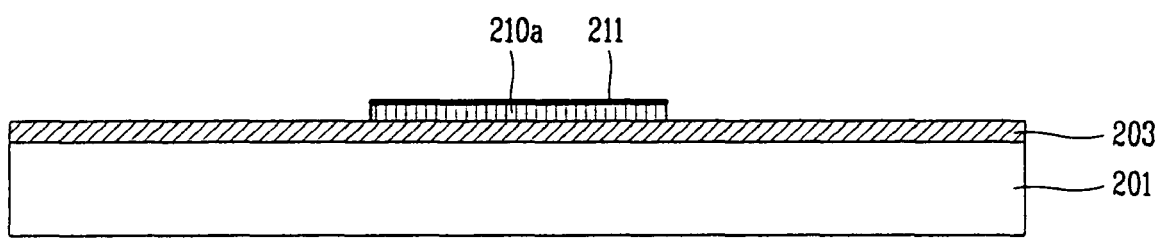

In FIG. 5D, only the second TiOx layer 210b may be removed by the etching solution so that only the first TiOx layer 210a, which is a TiOx pattern, may remain on a surface of the metal layer 203.

Figure 5E:
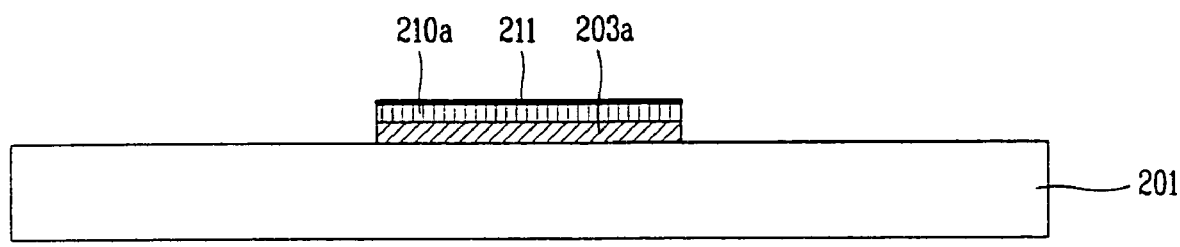

In FIG. 5E, an etching solution may be used to remove portions of the metal layer 203, wherein a patterned portion 203a of the metal layer 203 under the first $TiO_2$ layer 210a may remain on the surface of the substrate 201.

Figure 5F:
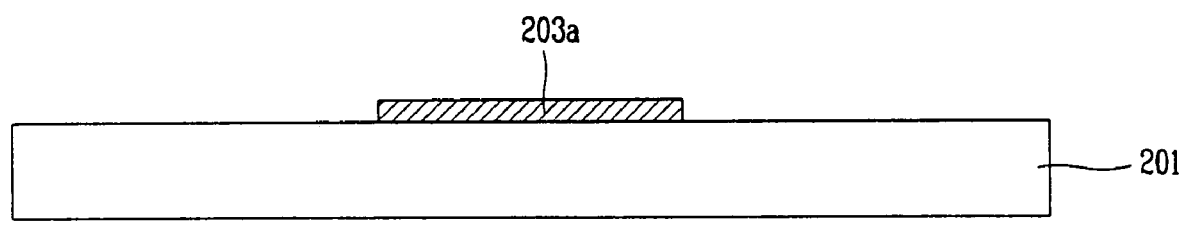

In FIG. 5F, an etching gas, such as $Cl_2/N_2$ or $CF_4/Cl_2$, may be applied to the first $TiO_2$ layer 210a to remove the first $TiO_2$ layer 210a, thereby forming the patterned portion 203a of the metal layer 203 on the surface of the substrate 201.

Figure 6A:
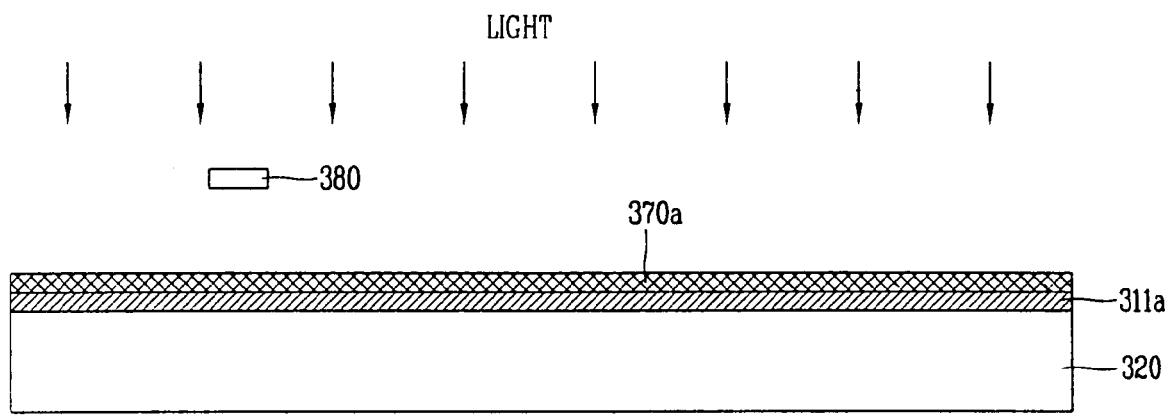

FIGS. 6A-6J are cross sectional views of an exemplary method of fabricating an LCD device according to the present invention. In FIG. 6A, a metal, such as Al, an Al alloy, or Cu, may be deposited on a first substrate 320 made of a transparent material, such as glass, to form a metal layer 311a. Then, a Ti layer 370a may be formed on the metal layer 311a. Next, a mask 380 may be positioned above the Ti layer 370a and light, such as ultraviolet rays or laser light, may be irradiated in a nitrogen environment. Accordingly, as detailed above, regions of the Ti layer 370a irradiated by the light are converted into TiN layer.

Figure 6B:
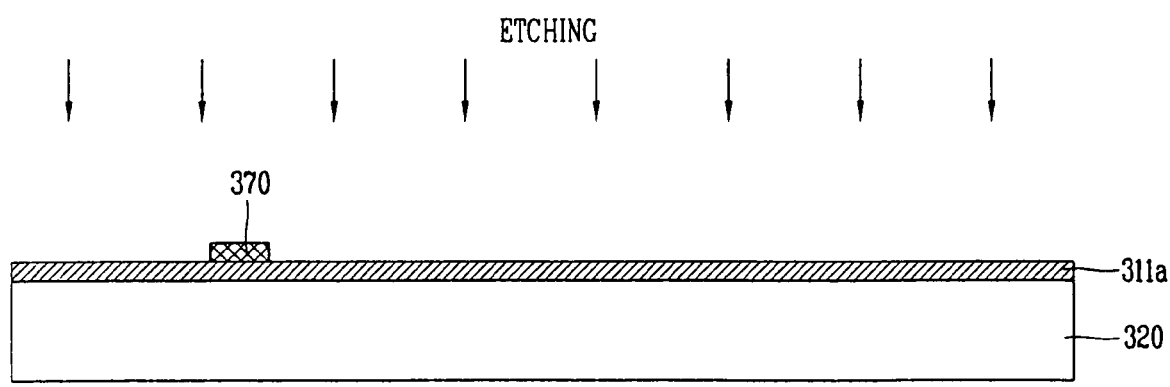

In FIG. 6B, the regions of the converted TiN layer may be removed by applying an etching gas, such as $Cl_2$ gas or a $Cl_2$ mixed gas, wherein only a Ti pattern 370 may remain on the surface of the metal layer 311a.

Figure 6C:
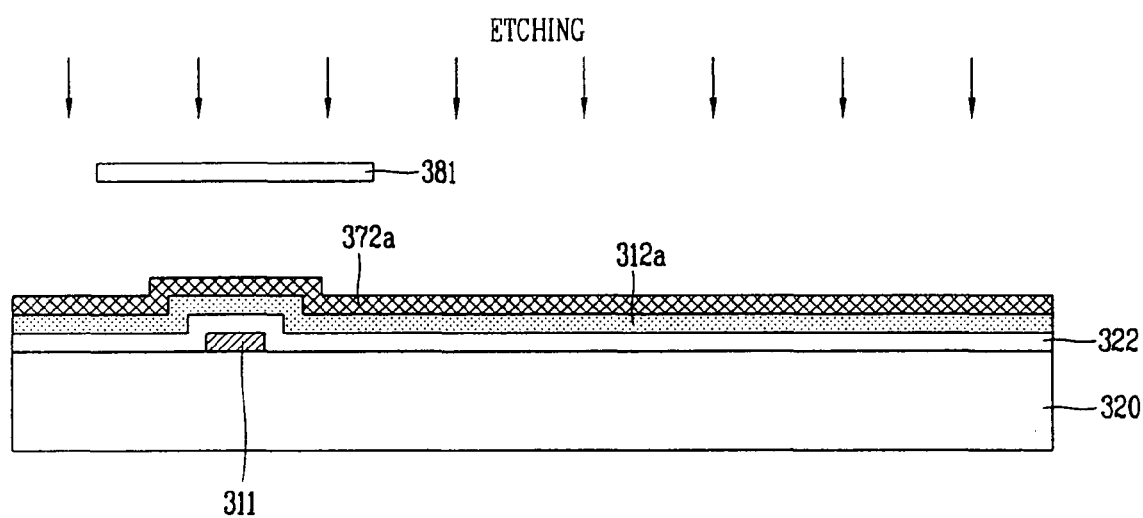

In FIG. 6C, the metal layer 311a may be etched using a dry or wet etching process, wherein only portions of the metal layer 311a under the Ti pattern 370 may remain on the surface of the substrate 320. Accordingly, a gate electrode 311 and the overlying Ti pattern 370 may remain on the first substrate 320. Although the gate electrode 311 is shown to include a single layer structure, the gate electrode 311 may include a plurality of layers.

Then, a gate insulating layer 322 may be deposited over an entire surface of the first substrate 320 using a chemical vapor deposition (CVD) process, a semiconductor layer 312a may be deposited on the gate insulating layer 322, and a Ti layer 372a may be formed on the semiconductor layer 312a. Next, a region of the Ti layer 372a may be covered using a mask 381 and light, such as ultraviolet rays or laser light, may be irradiated in a nitrogen atmosphere onto other regions of the Ti layer 372a not covered by the mask 381. Accordingly, the regions of the Ti layer 372a not covered by the mask 381 may be converted into TiN.

Figure 6D:
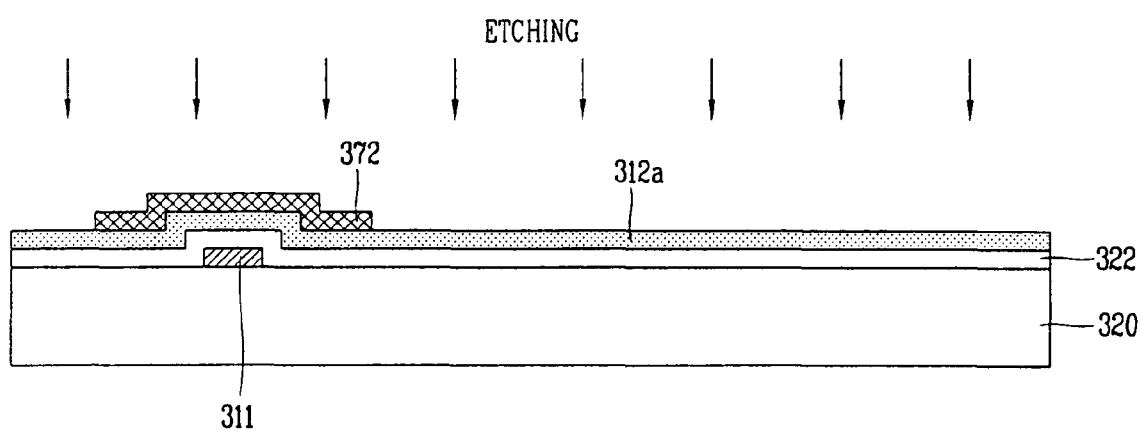

In FIG. 6D, the TiN regions of the Ti layer 372a may be removed by applying an etching gas, such as $Cl_2$ gas or a $Cl_2$ mixed gas, wherein only the Ti pattern 372 may remain on the surface of the semiconductor layer 312a.

In FIG. 6E, portions of the semiconductor layer 312a not covered the Ti pattern 372 (in FIG. 6D) may be removed to form a semiconductor layer 312 on the surface of the gate insulating layer 322. Then, a metal layer 313a, such as Cr, Mo, Al, an Al alloy and Cu, may be formed on an entire surface of the first substrate 320 and a Ti layer 374a may be formed on the metal layer 313a. When the light is irradiated onto the Ti layer 374a, portions of the Ti layer 374a not covered by a mask 382 may be converted in TiN.

In FIG. 6F, the converted TiN may be removed using an etching gas to form a Ti pattern 374 on the surface of the metal layer 313a.

Figure 6G:
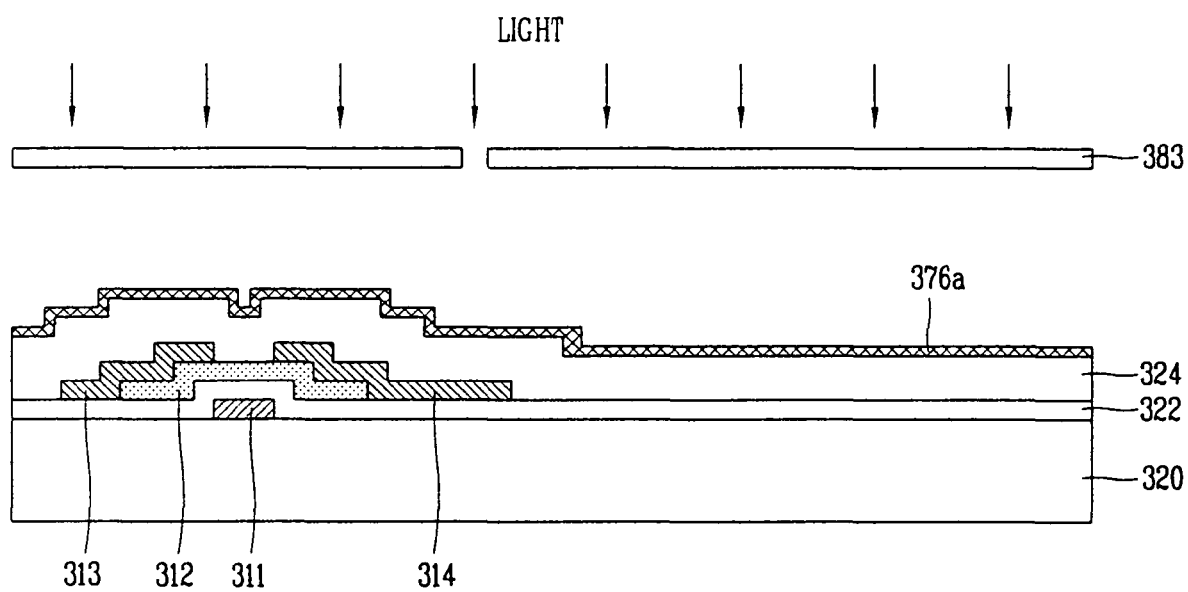

In FIG. 6G, the metal layer 313a may be etched using the Ti pattern 374 as a masking layer and the Ti pattern 374 may be removed. Accordingly, a source electrode 313 and a drain electrode 314 may be formed on the surface of the semiconductor layer 312. Although not shown, the source and drain electrodes 313 and 314 may each include a plurality of layers. Then, a passivation layer 324 may be deposited over an entire surface of the first substrate 320 and a Ti layer 376a may be formed on the passivation layer 324. Next, light may be irradiated onto the Ti layer 376a, wherein portions of the Ti layer 376a not covered by a mask 383 may be converted into TiN.

Figure 6H:
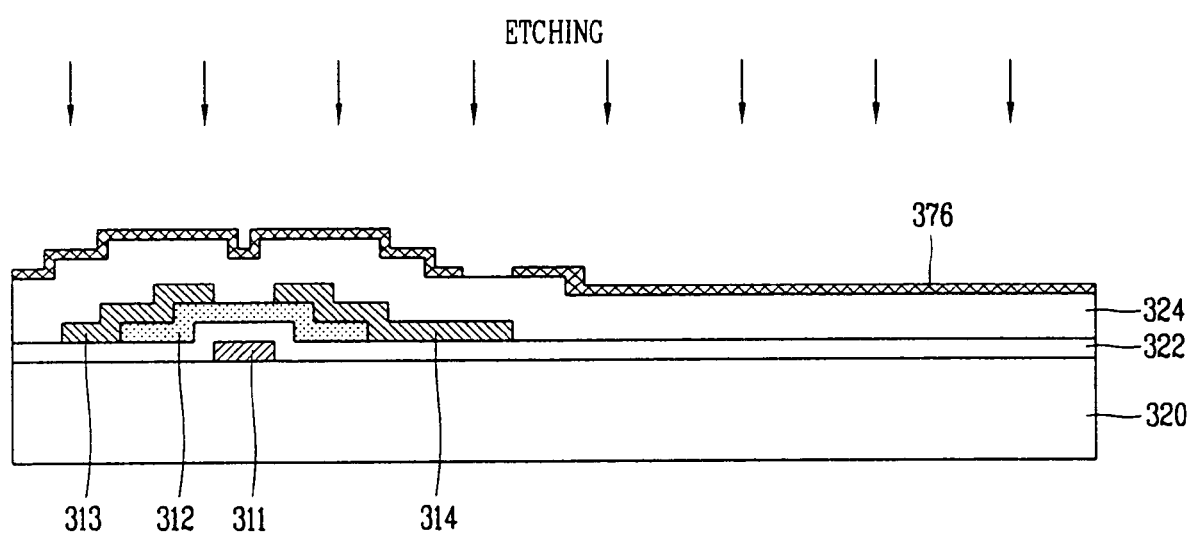

In FIG. 6H, the TiN may be removed using an etching gas to form a Ti pattern 376 on the surface of the passivation layer 324.

Figure 6I:
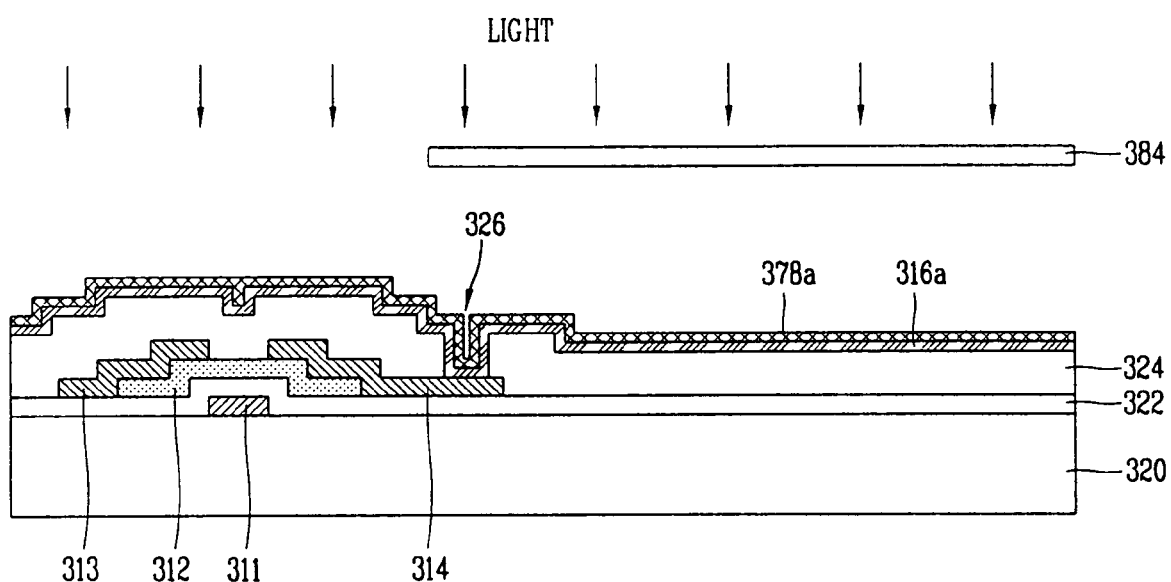

In FIG. 6I, the passivation layer 324 may be dry-etched using the Ti pattern 376 as a masking layer to form a contact hole 326, and the Ti pattern 376 may be removed. Then, a transparent electrode 316a made of ITO (indium Tin Oxide) or IZO (indium zinc oxide), for example, may be formed on the passivation layer 324 including the contact hole 326, and a Ti layer 378a may be formed on the passivation layer 324. Next, a mask 384 may be positioned above the Ti layer 378a, and light may be irradiated onto portions of the Ti layer 378a not covered by the mask 384, thereby forming a Ti pattern (not shown) on the surface of the transparent electrode 316a.

Figure 6J:
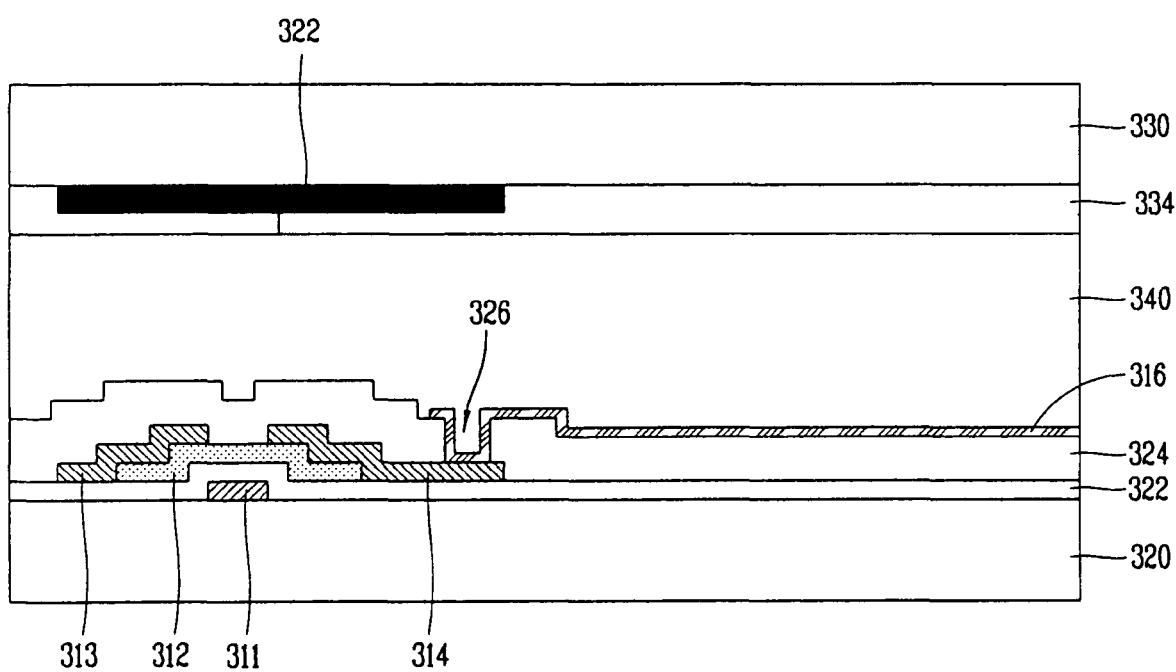

In FIG. 6J, the transparent electrode 316a may be etched using the Ti pattern (not shown) and the Ti pattern may be removed. Accordingly, a pixel electrode 316 may be formed on the surface of the passivation layer 324 and may be connected to the drain electrode 314 via the contact hole 326. In addition, a black matrix 332 and a color filter layer 334 may be formed on a second substrate 330, and the first and second substrates 320 and 330 may be bonded together with a liquid crystal material disposed therebetween.

Figure 7:
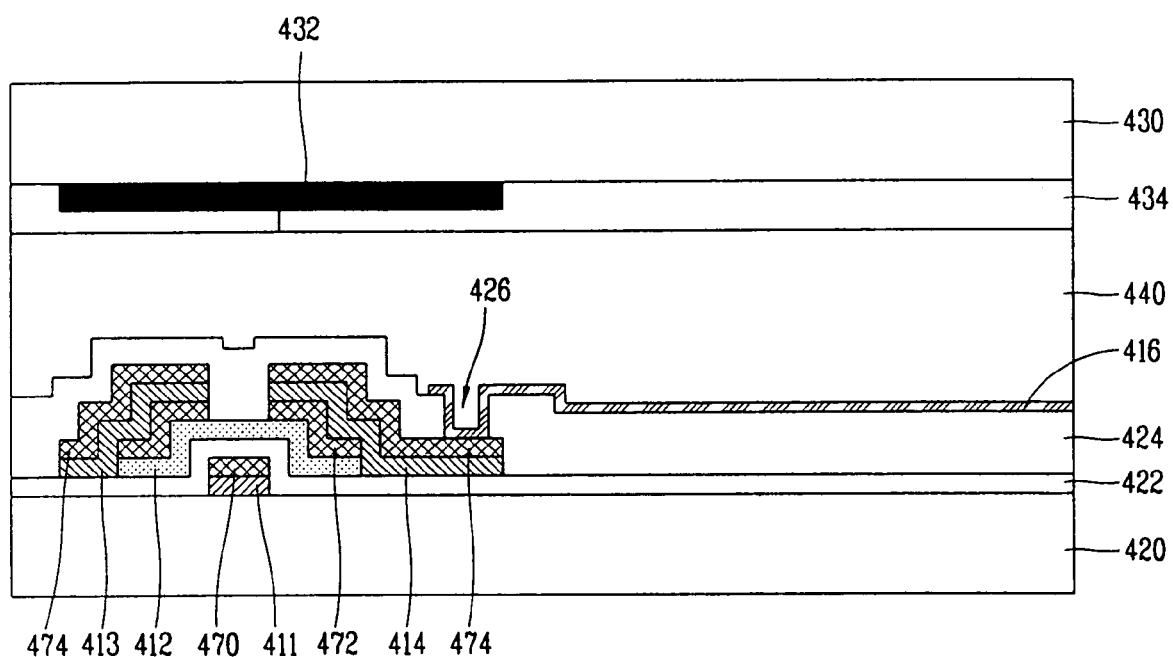
FIG. 7 is a cross sectional view of an exemplary LCD device according to the present invention.

Alternatively, the Ti masking layers of FIGS. 6A-6J may not be removed such that the Ti masking layers remain in the final LCD device. FIG. 7 shows an exemplary LCD device that includes the Ti masking layers. Since the exemplary device of FIG. 7 may be fabricated by a method similar to the method shown in FIGS. 6A-6J, descriptions of similar structures of the LCD device shown in FIGS. 6A-6J have been omitted.

In FIG. 7, Ti layers 470, 472 and 474 may be formed on a gate electrode 411, a semiconductor layer 412, and source and drain electrodes 413 and 414, respectively. Since Ti has good electrical contact characteristics and low electrical resistance, the Ti layers 470, 472, and 474 may be removed or may included in the LCD device. When the Ti layers 470, 472, and 474 are to be included in the LCD device, removal processes (i.e., etching processes) of the Ti masking layers (i.e., Ti patterns) may not be necessary, thereby simplifying the fabrication processes.

In FIG. 7, since the Ti layers 472 may remain on the semiconductor layer 412 and the semiconductor layer 412 may include silicon, the Ti layers 472 may react with the silicon in the semiconductor layer 412 to form Ti-silicon compounds. Accordingly, since the Ti-silicon compounds have low contact resistance, the semiconductor layer 412 may be ohmically-contacted with the source and drain electrodes 413 and 414. That is, the Ti-silicon compounds may function as ohmic contact layers between the source and drain electrodes 413 and 414 and the semiconductor layer 412.

In the method shown in FIGS. 6A-6J, the LCD device may be fabricated using only the Ti masking layers. However, the LCD device may be fabricated using both the Ti masking layers and the photoresist layers. Accordingly, the Ti masking layers of the LCD device shown in FIG. 7 may be formed on at least one of the gate electrode 411, the semiconductor layer 412, and the source and drain electrodes 413 and 414. In addition the Ti masking layers may also be formed on all patterned layers of the LCD device.

Figure 8A:
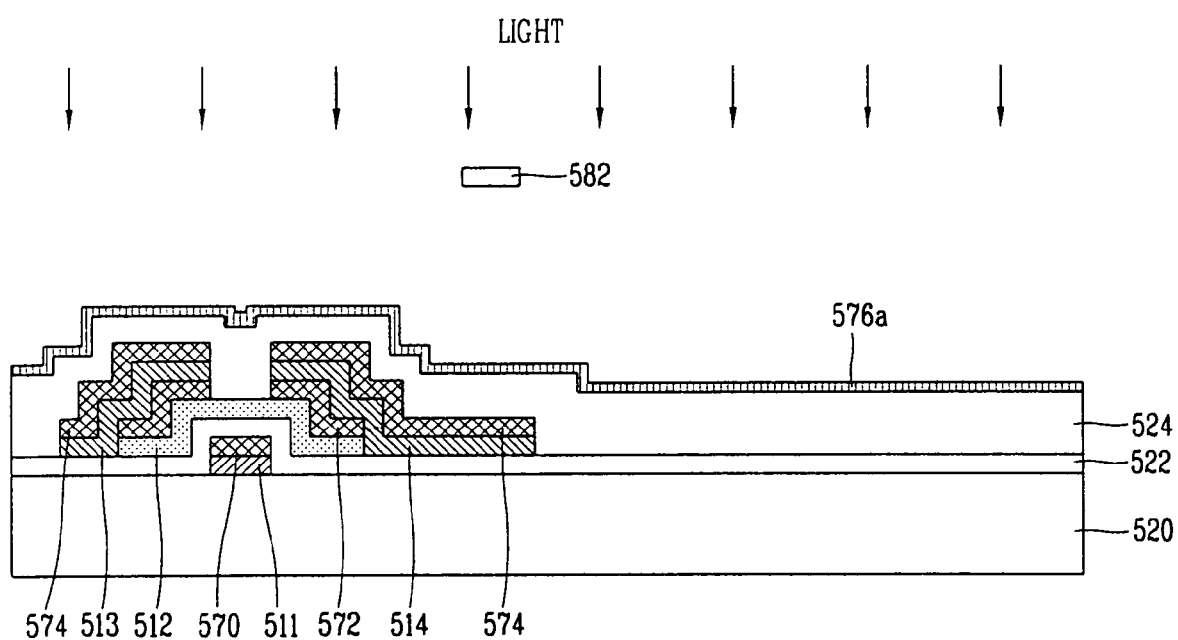
FIGS. 8A-8E are cross sectional views of another exemplary method of fabricating an LCD device according to the present invention.

FIGS. 8A-8D are cross sectional views of another exemplary method of fabricating an LCD device according to the present invention. In FIG. 8A, a gate electrode 511 and a first Ti pattern 570 may be formed on a first substrate 520 using a Ti masking layer and/or a photoresist layer. Then, a gate insulating layer 522 may be deposited over an entire surface of the first substrate 520. Next, a semiconductor layer 512 and second Ti pattern layers 572 may be formed on the gate insulating layer 522. In addition, a source electrode 513, a drain electrode 514, and third Ti pattern layers 574 may be formed on the second Ti pattern layers 572.

Next, a passivation layer 524 may be formed on an entire surface of the first substrate 520 upon which the source and drain electrodes 513 and 514 may be formed. Then, a TiOx layer 576a may be formed on the passivation layer 524, wherein light, such ultraviolet light or laser light, may be irradiated onto surface portions of the TiOx layer 576a using a mask 582. Accordingly, a surface region of the TiOx layer 576a upon which the light has not been irradiated may have hydrophobic properties, and the surface portions 577 (in FIG. 8B) of the TiOx layer 576a upon which the light has been irradiated may have hydrophilic properties.

Figure 8B:
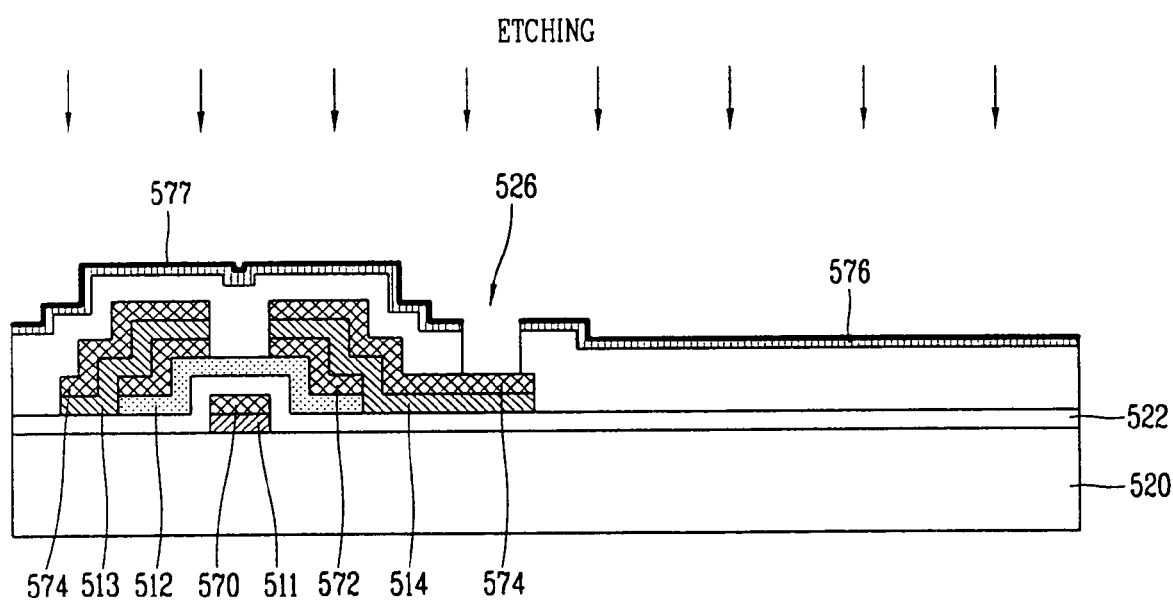

In FIG. 8B, an etching solution, such as an alkali-based solution or $H_2SO_4$, may be applied to different surface portions of the TiOx layer. Accordingly, the unexposed surface portions of the TiOx layer having the hydrophobic properties may be removed so that only a first TiOx layer pattern 576 having the hydrophilic properties remains on the surface of the passivation layer 524. In addition, the surface portions 577 of the TiOx layer pattern 576 may remain on the surface of the TiOx layer pattern 576. Then, a portion of the passivation layer 524 may be etched using the first TiOx layer pattern 576 as an etch-blocking layer to form a contact hole 526 exposing a portion of one of the third Ti pattern layers 574 that corresponds to the drain electrode 514. Alternatively, the surface portions 577 of the first TiOx layer pattern 576 may be removed since $TiO_2$ has a resistivity of $10^3$ Ωcm and a transmittivity of about 85%. Accordingly, the first $TiO_2$ pattern 576 may not necessarily adversely affect light transmission of the LCD device.

Figure 8C:
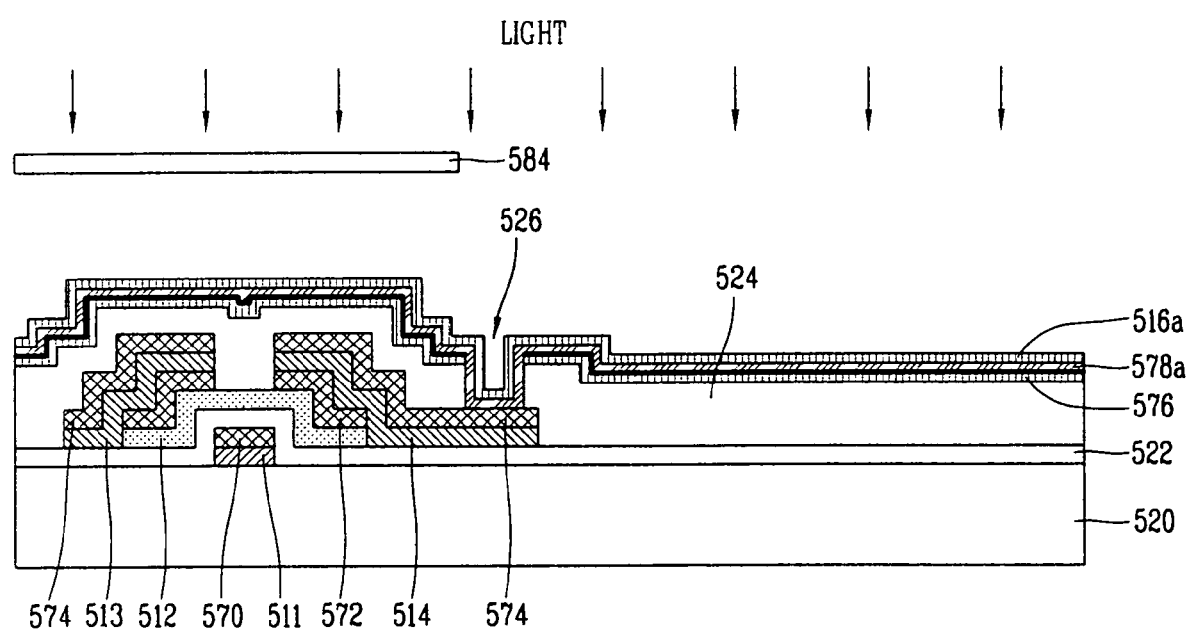

In FIG. 8C, a TiOx layer 578a may be formed on the first TiOx layer pattern 576 including in the contact hole 526. Then, a transparent electrode 516a, such as ITO or IZO, may be deposited on an entire surface of the first substrate 520 and the TiOx layer 578a. Next, light may be irradiated onto surface portions of the transparent electrode 516a using a mask 584 to cover regions of the transparent electrode 516a corresponding to the semiconductor layer 512. Accordingly, the surface portions of the transparent electrode 516a upon which the light is irradiated may be converted to have hydrophilic properties, and the surface of the transparent electrode 516a upon which the light is not irradiated may have hydrophobic properties.

Figure 8D:
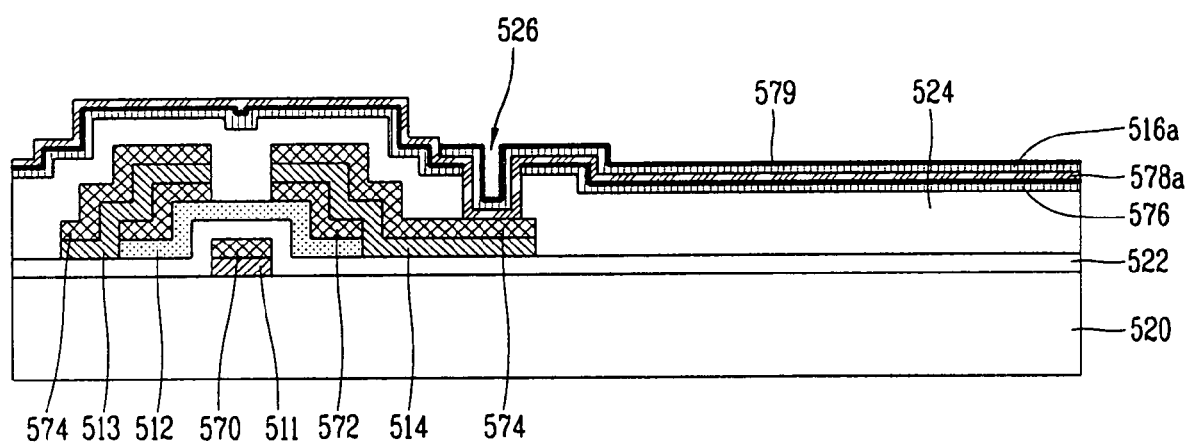

In FIG. 8D, the transparent electrode 516a may be etched, wherein the exposed surfaces of the transparent electrode 516a having the hydrophilic properties may be remove and the unexposed surfaces of the transparent electrode 516a having the hydrophobic properties may remain on the surface of the TiOx layer 578a. Accordingly, only a second TiOx pattern 579 including the surface of the transparent electrode 516a having the hydrophilic properties may remain.

Figure 8E:
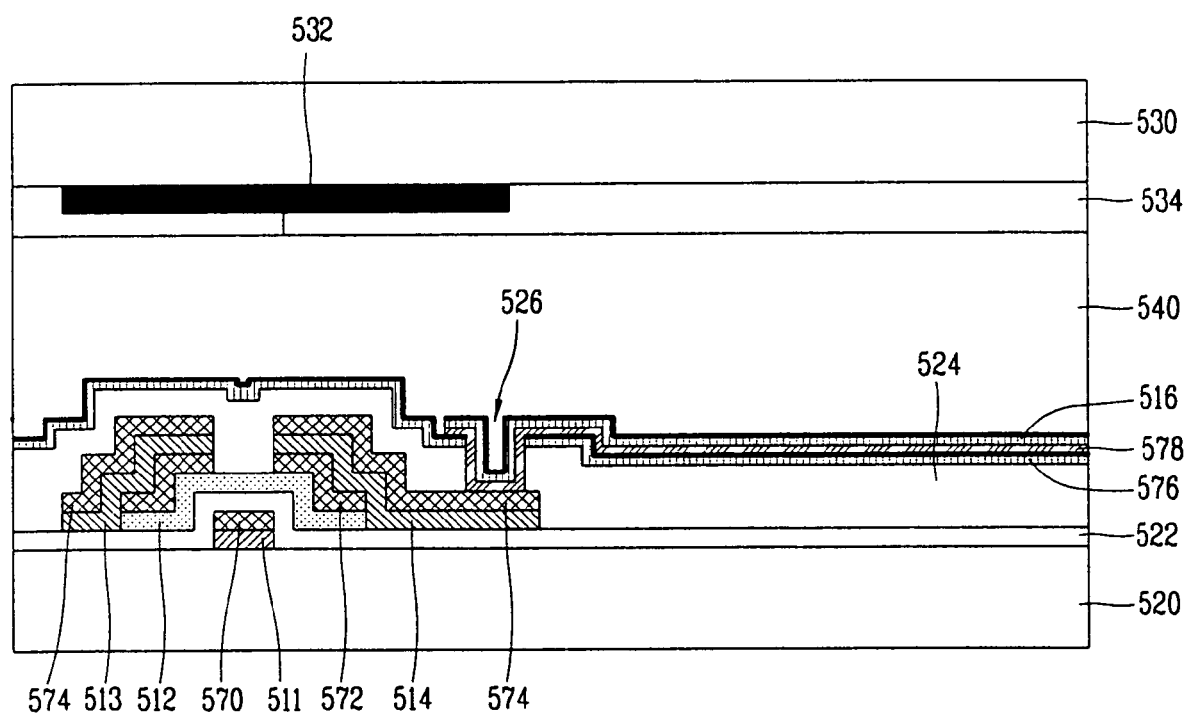

In FIG. 8E, an etchant may be applied to the TiOx layer 578 using the second TiOx pattern 579 as a mask layer, wherein the unexposed portions of the TiOx layer 578 may be removed. Accordingly, a pixel electrode may be formed. In addition, similar to the first TiOx pattern 576, the second $TiO_2$ pattern 578 may be removed or may remain on the pixel electrode layer 516.

A second substrate 530 may include a black matrix 532 and a color filter layer 534, wherein the first and second substrates 520 and 530 may be bonded together with a liquid crystal material 540 disposed therebetween.

According to the present invention, a LCD device may be formed using patterns formed of Ti and/or TiOx. However, the LCD device may be fabricated using only Ti, both Ti and a photoresist, or both Ti and TiOx. In addition, the LCD device may be fabricated by using Ti, TiOx, and the photoresist in combination.

In addition, according to the present invention, the LCD device may be fabricated with a Ti layer on at least one of the gate electrode, the semiconductor layer, and the source electrode/drain electrode. Moreover, it is possible to form the TiOx layer on at least one of the passivation layer and the pixel electrode, or form the TiOx layer on the gate electrode, the semiconductor layer, and the source electrode/drain electrode.

It will be apparent to those skilled in the art that various modifications and variations can be made in the LCD device and method of fabricating an LCD device of the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, comprising:
   providing a first substrate;
   forming a gate electrode on a first substrate;
   forming a gate insulating layer on an entire surface of the first substrate including the gate electrode;
   forming a semiconductor layer on the gate insulating layer;
   forming source/drain electrodes on the semiconductor layer;
   forming a passivation layer on the gate insulating layer and the source/drain electrodes; and
   forming a pixel electrode on the passivation layer,
   wherein at least one of the gate electrode, semiconductor layer, source/drain electrodes, and pixel electrode is formed by etching an etching subject layer by a metal mask layer including a Ti layer and a TiN layer.

2. The method according to claim 1, wherein the forming a gate electrode comprises:
   forming a metal layer on the first substrate;
   forming the Ti layer on the metal layer;
   irradiating light onto a portion of the Ti layer using a mask to convert the exposed portion of the Ti layer into the TiN layer;
   removing the TiN layer;
   etching the metal layer using the Ti layer as a mask; and
   removing the Ti layer.

3. The method according to claim 2, wherein the TiN layer is removed using an etching gas.

4. The method according to claim 2, wherein the Ti layer is removed using an etching solution or gas.

5. The method according to claim 1, wherein the forming a semiconductor layer comprises:
   depositing the semiconductor layer on the gate insulating layer;
   forming the Ti layer on the semiconductor layer;
   irradiating light onto a portion of the Ti layer using a mask to convert the exposed portions of the Ti layer into a TiN layer;
   removing the TiN layer;
   etching the semiconductor layer using the Ti layer as a mask; and
   removing the Ti layer.

6. The method according to claim 5, wherein the TiN layer is removed using an etching gas.

7. The method according to claim 5, wherein the Ti layer is removed using an etching solution or gas.

8. The method according to claim 1, wherein the forming source/drain electrodes comprises:
   forming a metal layer on the semiconductor layer;
   forming the Ti layer on the metal layer;
   irradiating light onto a portion of the Ti layer using a mask to convert the exposed portion of the Ti layer into a TiN layer;
   removing the TiN layer;
   etching the metal layer using the Ti layer as a mask; and
   removing the Ti layer.

9. The method according to claim 8, wherein the TiN layer is removed using an etching gas.

10. The method according to claim 8, wherein the Ti layer is removed using an etching solution or gas.

11. The method according to claim 1, wherein the forming of a pixel electrode comprises:
    forming an indium tin oxide layer on the passivation layer;
    forming the Ti layer on the indium tin oxide layer;
    irradiating light onto a portion of the Ti layer using a mask to convert the exposed portion of the Ti layer into a TiN layer;
    removing the TiN layer;
    etching the indium tin oxide layer using the Ti layer as a mask; and
    removing the Ti layer.

12. The method according to claim 11, wherein the TiN layer is removed using an etching gas.

13. The method according to claim 11, wherein the Ti layer is removed using an etching solution or gas.

14. The method according to claim 1, further comprising forming a contact hole in the passivation layer to electrically interconnect the pixel electrode to the drain electrode.

15. The method according to claim 14, wherein the forming of a contact hole comprises:
    forming a Ti layer on the passivation layer;
    irradiating light onto a portion of the Ti layer using a mask to convert the exposed portion of the Ti layer into a TiN layer;
    removing the TiN layer;
    etching the passivation layer using the Ti layer as a mask; and
    removing the Ti layer.

16. The method according to claim 15, wherein the TiN layer is removed using an etching gas.

17. The method according to claim 15, wherein the Ti layer is removed using an etching solution or gas.

18. The method according to claim 1, further comprising:
    forming a black matrix and a color filter layer on a second substrate;
    bonding the first and second substrates together; and
    forming a liquid crystal material layer between the bonded first and second substrates.

* * * * *